US012793748B2

(12) United States Patent
Pao et al.

(10) Patent No.: US 12,793,748 B2
(45) Date of Patent: Nov. 10, 2026

(54) STATIC RANDOM ACCESS MEMORY CELL POWER SUPPLY

(71) Applicant: Taiwan Semiconductor Manufacturing Company, Ltd., Hsinchu (TW)

(72) Inventors: Chia-Hao Pao, Kaohsiung City (TW); Kian-Long Lim, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/572,935

(22) Filed: Jan. 11, 2022

(65) Prior Publication Data

US 2023/0013651 A1 Jan. 19, 2023

Related U.S. Application Data

(60) Provisional application No. 63/222,579, filed on Jul. 16, 2021.

(51) Int. Cl.
*G11C 11/00* (2006.01)
*G11C 5/14* (2006.01)
*G11C 11/412* (2006.01)
*G11C 11/417* (2006.01)

(52) U.S. Cl.
CPC ............ *G11C 5/145* (2013.01); *G11C 11/412* (2013.01); *G11C 11/417* (2013.01)

(58) Field of Classification Search
CPC ....... G11C 5/145; G11C 11/41; G11C 11/412; G11C 11/413; G11C 11/417
USPC .......................................................... 365/156
See application file for complete search history.

(56) References Cited

U.S. PATENT DOCUMENTS

| | | | | |
|---|---|---|---|---|
| 6,657,887 | B2 * | 12/2003 | Higeta | G11C 11/417 365/230.06 |
| 7,292,495 | B1 * | 11/2007 | Kenkare | G11C 11/419 365/226 |
| 8,310,898 | B2 * | 11/2012 | Kushida | G11C 8/12 365/210.12 |
| 9,093,530 | B2 | 7/2015 | Huang et al. | |
| 9,171,929 | B2 | 10/2015 | Lee et al. | |
| 9,208,900 | B2 * | 12/2015 | Sinangil | G11C 7/12 |
| 9,214,555 | B2 | 12/2015 | Oxland et al. | |
| 9,236,267 | B2 | 1/2016 | De et al. | |
| 9,299,395 | B2 * | 3/2016 | Kulkarni | G11C 7/12 |
| 9,520,482 | B1 | 12/2016 | Chang et al. | |
| 9,548,303 | B2 | 1/2017 | Lee et al. | |
| 9,564,489 | B2 | 2/2017 | Yeo et al. | |
| 9,576,814 | B2 | 2/2017 | Wu et al. | |
| 9,601,342 | B2 | 3/2017 | Lee et al. | |
| 9,608,116 | B2 | 3/2017 | Ching et al. | |
| 9,627,040 | B1 * | 4/2017 | Chang | G11C 11/418 |

(Continued)

*Primary Examiner* — Tha-O H Bui
(74) *Attorney, Agent, or Firm* — Sterne, Kessler, Goldstein & Fox P.L.L.C.

(57) ABSTRACT

A memory system can include a circuit with a first voltage supply, a second voltage supply, pull-up devices, pull-down devices, and pass devices. The first voltage supply is configured to provide a first voltage. The first voltage supply is configured to apply the first voltage to gate terminals of the pass devices. The second voltage supply is electrically coupled to S/D terminals of the pull-up devices and is configured to transition from the first voltage to the second voltage for a read operation.

20 Claims, 7 Drawing Sheets

(56) References Cited

U.S. PATENT DOCUMENTS

| | | | | |
|---|---|---|---|---|
| 9,680,371 | B2 * | 6/2017 | Saadat | H02M 3/07 |
| 9,922,698 | B2 * | 3/2018 | Yamaoka | G11C 5/14 |
| 2003/0133335 | A1 * | 7/2003 | Ohbayashi | G11C 11/4125<br>257/E27.099 |
| 2023/0009820 | A1 | 1/2023 | Yen et al. | |

* cited by examiner

STATIC RANDOM ACCESS MEMORY CELL POWER SUPPLY

CROSS-REFERENCE TO RELATED APPLICATION

This application claims the benefit of U.S. Provisional Patent Application No. 63/222,579, titled "SRAM VMAX Enhancement," which was filed on Jul. 16, 2021 and is incorporated herein by reference in its entirety.

BACKGROUND

Static random access memory (SRAM) is a type of semiconductor memory used in computing applications that require, for example, high-speed data access. For example, cache memory applications use SRAM to store frequently-accessed data—e.g., data accessed by a central processing unit.

The SRAM's cell structure and architecture enable high-speed data access. The SRAM cell can include a bi-stable flip-flop structure with, for example, four to ten transistors. An SRAM architecture can include one or more arrays of memory cells and support circuitry. Each of the SRAM arrays is arranged in rows and columns called "wordlines" and "bitlines," respectively. The support circuitry includes address and driver circuits to access each of the SRAM cells-via the wordlines and bitlines—for various SRAM operations.

BRIEF DESCRIPTION OF THE DRAWINGS

Aspects of the present disclosure are best understood from the following detailed description when read with the accompanying figures. It is noted that, according to the standard practice in the industry, various features are not drawn to scale. In fact, the dimensions of the various features may be arbitrarily increased or reduced for clarity of discussion.

DETAILED DESCRIPTION

Figure 1:
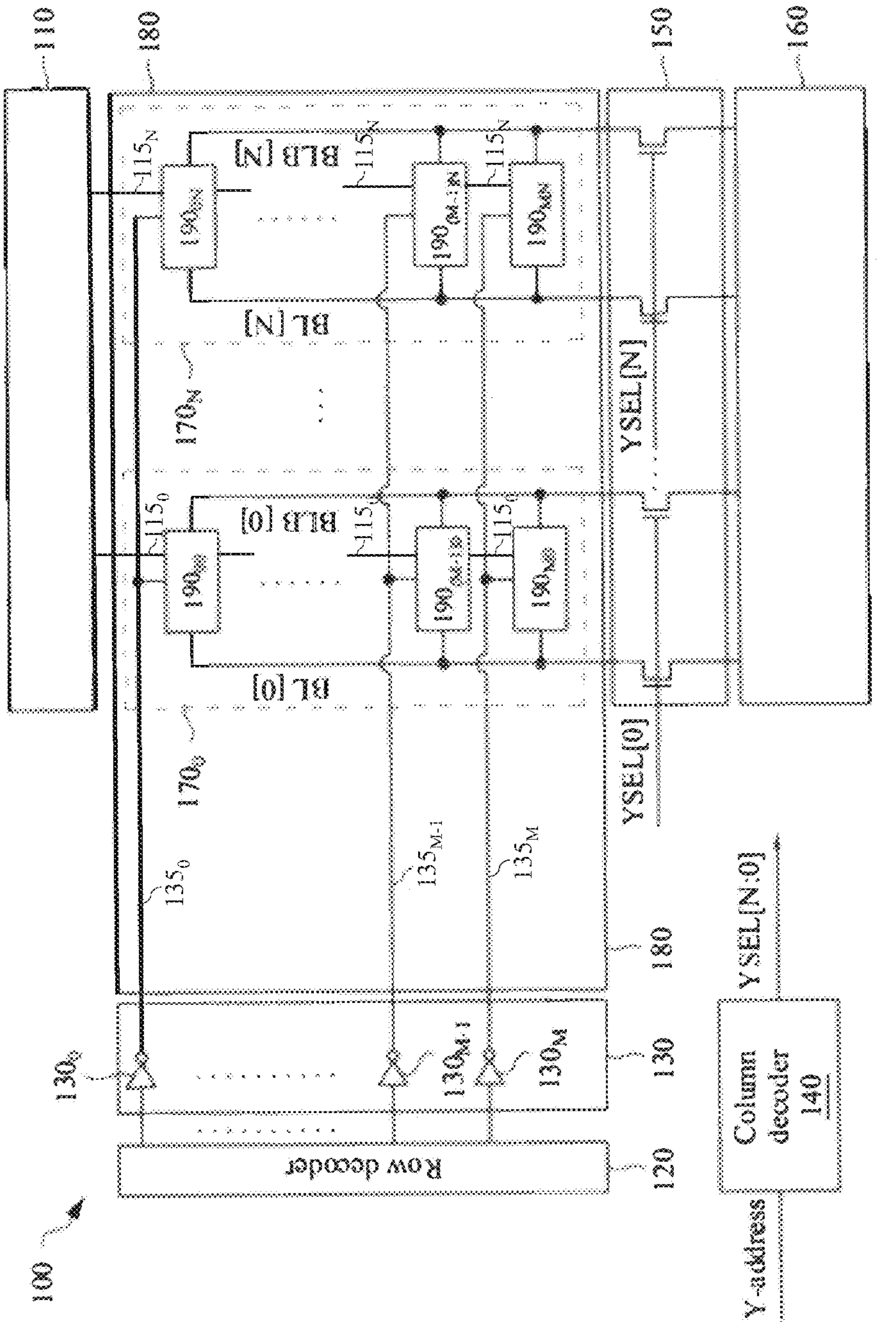
FIG. 1 is an illustration of a static random access memory with a memory cell power supply, according to some embodiments of the present disclosure.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

Embodiments of the present disclosure describe a memory system with a memory cell power supply circuit to mitigate or prevent a data flip in a memory cell during a memory read operation. During the memory read operation, the memory cell power supply circuit can provide voltage higher than that of a logic high voltage level of a wordline driver. The higher voltage level provided by the memory cell power supply circuit can be applied to source/drain terminals of pull-up devices in the memory cell to increase a gate drive in pull-down devices in the memory cell, thus mitigating or preventing the data flip.

The following disclosure describes aspects of a static random access memory (SRAM). Specifically, the disclosure describes different embodiments related to an SRAM cell power supply. For ease of explanation, certain SRAM circuit elements and control circuits are disclosed to facilitate in the description of the different embodiments. The SRAM can also include other circuit elements and control circuits. These other circuit elements and control circuits are within the spirit and scope of this disclosure.

FIG. 1 is an illustration of a static random access memory (SRAM) device 100 with a memory cell power supply circuit 110, according to some embodiments of the present disclosure. SRAM device 100 also includes a row decoder 120, a wordline driver 130, a column decoder 140, a column multiplexer (MUX) 150, a read/write circuit 160, and an SRAM array 180. SRAM array 180 includes columns of SRAM cells $\mathbf{170_0}$-$\mathbf{170_N}$. SRAM device 100 can include other circuit elements and control circuits, which are not shown in FIG. 1.

Each of the SRAM cells in SRAM array 180 is accessed—e.g., for memory read and memory write operations—using a memory address. Based on the memory address, row decoder 120 selects a row of memory cells to access via a wordline driver output 135 of wordline driver 130. Also, based on the memory address, column decoder 140 selects a column of memory cells $\mathbf{170_0}$-$\mathbf{170_N}$ to access via column MUX 150. For a memory read operation, read/write circuit 160 senses a voltage level on bitline pairs BL/BLB. For a memory write operation, read/write circuit 160 generates voltages for bitline pairs BL/BLB in columns of memory cells $\mathbf{170_0}$-$\mathbf{170_N}$. The notation "BL" refers to a bitline, and the notation "BLB" refers to the complement of BL. The intersection of the accessed row and the accessed column of memory cells results in access to a single memory cell 190.

In some embodiments, during a memory read operation, memory cell power supply circuit 110 provides memory cell power supplies 115$_0$-115$_N$ to columns of memory cells 170$_0$-170$_N$, respectively. FIG. 1 shows one memory cell power supply 115 electrically coupled to each column of memory cells 170. In some embodiments, though not shown in FIG. 1, one memory cell power supply 115 can be electrically coupled to multiple columns of memory cells—e.g., one memory cell power supply 115 can be electrically coupled to 2, 4, 8, 16, 32, or all columns of memory cells 170. The number of columns of memory cells 170 electrically coupled to each memory cell power supply 115 can depend on the circuit design of memory cell power supply circuit 110, according to some embodiments of the present disclosure.

Each of columns of memory cells 170$_0$-170$_N$, includes memory cells 190. Memory cells 190 can be arranged in one or more arrays in SRAM device 100. In the present disclosure, a single SRAM array 180 is shown to simplify the description of the disclosed embodiments. SRAM array 180 has "M" number of rows and "N" number of columns. The notation "190$_{00}$" refers to memory cell 190 located in row '0', column 170$_0$. Similarly, the notation "190$_{MN}$" refers to memory cell 190 located in row 'M', column 170$_N$.

Figure 2:
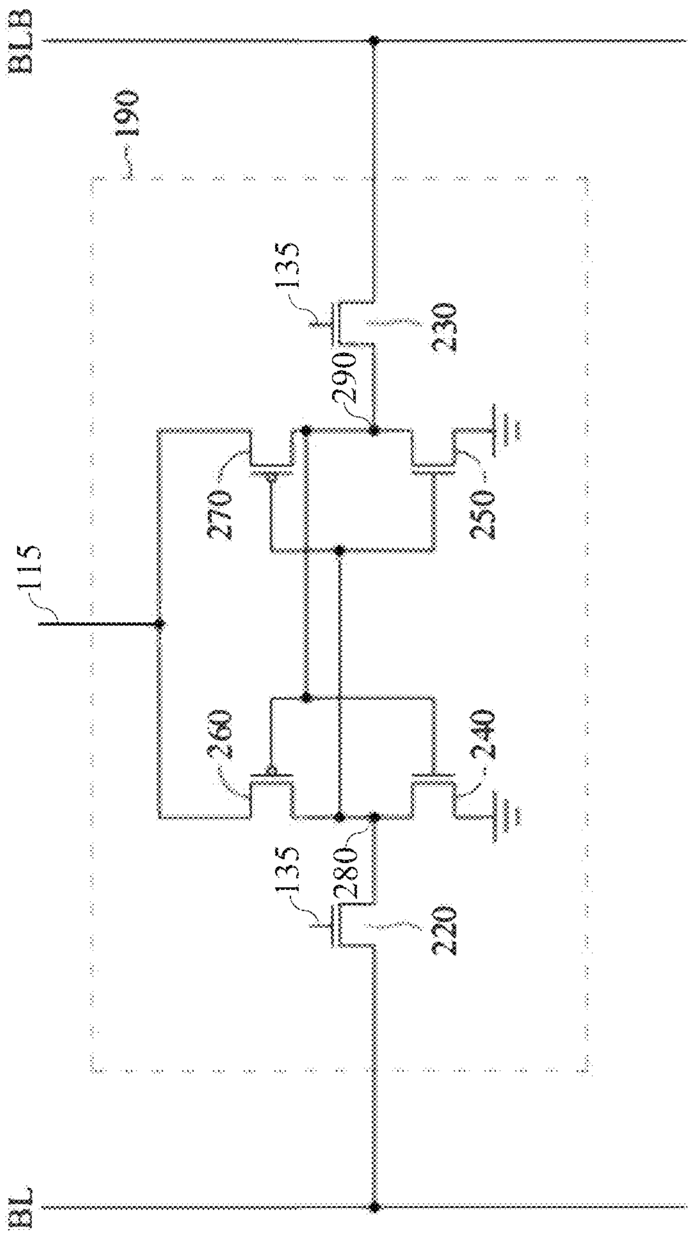
FIG. 2 is an illustration of a static random access memory circuit topology with a memory cell power supply, according to some embodiments of the present disclosure.

In some embodiments, memory cell 190 can have a six transistor ("6T") circuit topology. FIG. 2 is an illustration of an example 6T circuit topology for memory cell 190 with memory cell power supply 115, according to some embodiments of the present disclosure. The 6T circuit topology includes n-type field effect transistor (NFET) pass devices 220 and 230, NFET pull-down devices 240 and 250, and p-type FET (PFET) pull-up devices 260 and 270. The FET devices (e.g., NFET devices and PFET devices) can be planar metal-oxide-semiconductor FETs, finFETs, gate-all-around FETs, any suitable FETs, or combinations thereof. Other memory cell topologies, such as four transistor ("4T"), eight transistor ("8T"), and ten transistor ("10T") circuit topologies, are within the spirit and scope of the present disclosure.

Wordline driver output 135 controls NFET pass devices 220 and 230 to pass voltages from the bitline pair BL/BLB to a bi-stable flip-flop structure formed by NFET devices 240 and 250 and PFET devices 260 and 270. The bitline pair BL/BLB voltages can be used during a memory read operation and a memory write operation. During the memory read operation, the voltage applied by wordline driver output 135 to the gate terminals of NFET pass devices 220 and 230 can be at a sufficient voltage level, such as a logic high value (e.g., a power supply voltage, such as 1.0 V, 1.2 V, 1.8 V, 2.4 V, 3.3 V, 5 V, or any other suitable voltage), to pass voltages stored in the bi-stable flip-flop structure to the BL and BLB, which can be sensed by read/write circuit 160. For example, if a '1' or logic high value (e.g., a power supply voltage, such as 1.0 V, 1.2 V, 1.8 V, 2.4 V, 3.3 V, 5 V, and any other suitable voltage) is passed to the BL and a '0' or logic low value (e.g., ground or 0 V) is passed to the BLB, read/write circuit 160 can sense (or read) these values. During the memory write operation, if the BL is at a '1' or logic high value and the BLB is at a '0' or logic low value, the voltage applied by wordline driver 130 to the gate terminals of NFET pass devices 220 and 230 can be at a sufficient voltage level to pass the BL's logic high value and the BLB's logic low value to the bi-stable flip-flop structure. As a result, these logic values are written (or programmed) into the bi-stable flip-flop structure.

Further, during the memory write operation, memory cell power supply 115 provides a voltage level substantially equal to that of wordline driver output 135 (e.g., a power supply voltage, such as 1.0 V, 1.2 V, 1.8 V, 2.4 V, 3.3 V, 5 V, or any other suitable voltage), according to some embodiments of the present disclosure. In some embodiments, during the memory read operation, memory cell power supply 115 provides a voltage level higher than that of wordline driver output 135.

A benefit, among others, of providing the voltage level of memory cell power supply 115 higher than that of wordline driver output 135 during the memory read operation is to prevent a data flip when wordline driver output 135 transitions from a '0' or logic low value to a '1' or logic high value. Put differently, without memory cell power supply 115 at a voltage level higher than that of wordline driver output 135—e.g., memory cell power supply 115 and wordline driver output 135 are at substantially the same voltage level-voltage levels at nodes 280 and 290 can inadvertently transition from a '1' or logic high value to a '0' or logic low value, or vice versa, when wordline driver output 135 transitions from a '0' or logic low value to a '1' or logic high value.

Figure 3:
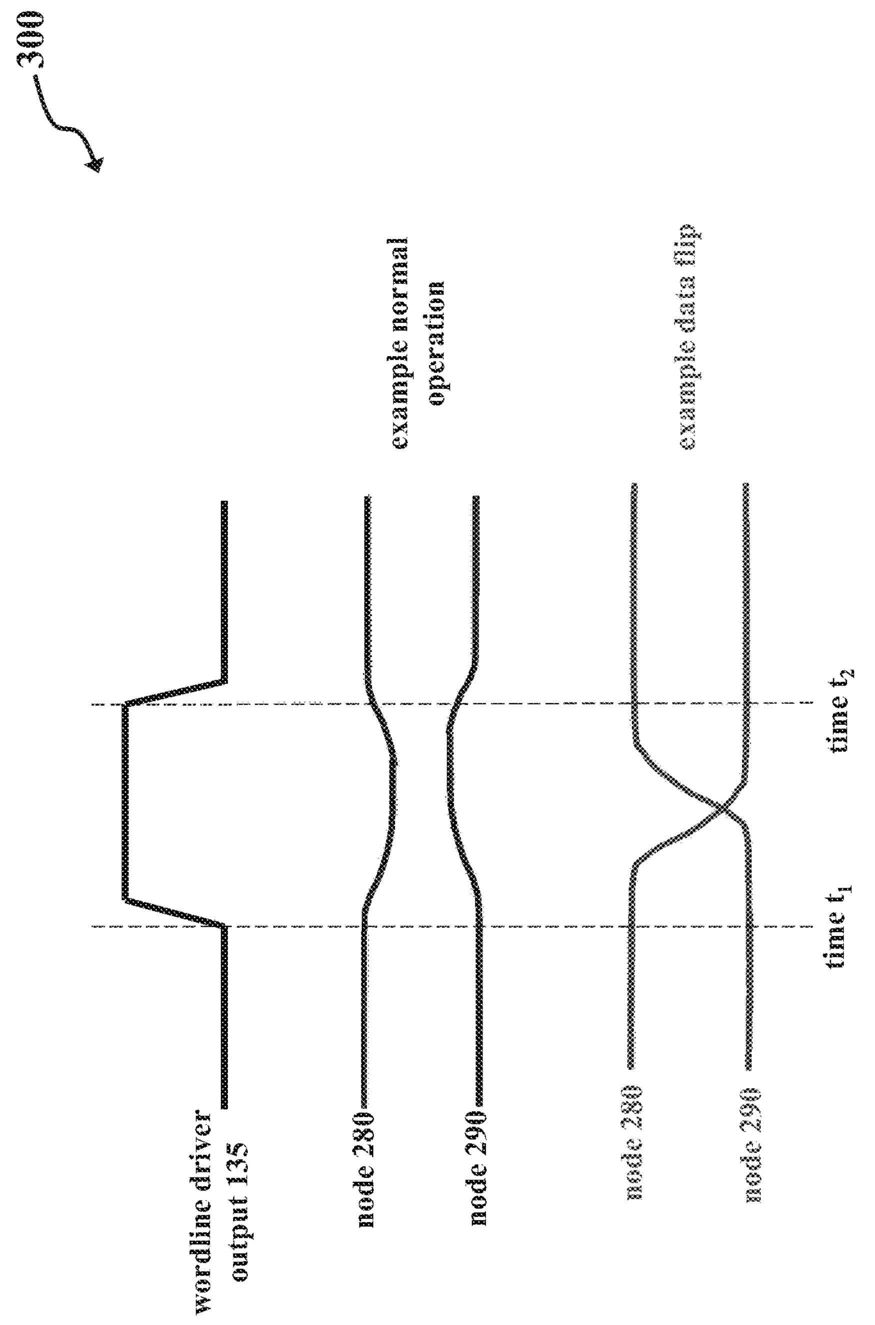
FIG. 3 is an illustration of example waveforms of a memory read operation of a memory cell and a data flip of the memory cell when a wordline driver output transitions from a logic low value to a logic high value during the memory read operation.

FIG. 3 shows example waveforms 300 of a memory read operation of memory cell 190 and a data flip of memory cell 190 when wordline driver output 135 transitions from a '0' or logic low value to a '1' or logic high value during the memory read operation. Example waveforms 300 are described with reference to SRAM device 100 of FIG. 1 and memory cell 190 of FIG. 2.

Between time $t_1$ and time $t_2$, memory cell 190 is accessed for the memory read operation. To access memory cell 190, at time $t_1$, wordline driver output 135 transitions from a '0' or logic low value (e.g., ground or 0 V) to a '1' or logic high value (e.g., a power supply voltage, such as 1.0 V, 1.2 V, 1.8 V, 2.4 V, 3.3 V, 5 V, or any other suitable voltage), thus turning on NFET pass devices 220 and 230 to pass voltages stored in the bi-stable flip-flop structure to the BL and BLB, respectively. For example, prior to time $t_1$, node 280 can be at a '1' or logic high value and node 290 can be at a '0' or logic low value.

In waveforms 300 for the example normal operation, when wordline driver output 135 transitions from a '0' or logic low value to a '1' or logic high value, node 290 can rise to a voltage level higher than its initial logic low value. Consequently, when node 290 rises in voltage level, node 280 can fall to a voltage level lower than its initial logic high value due to, for example, NFET pull-down device 240 having less gate drive. The rise in voltage level at node 290 and the fall in voltage level at node 280 are passed to the BLB and BL, respectively. At the end of the memory read operation, when wordline driver output 135 transitions from a '1' or logic high value to a '0' or logic low value at time $t_2$, node 280 and node 290 are re-stored to substantially the same voltage levels as those levels prior to time $t_1$.

Under certain conditions, such as at high temperatures, the rise in voltage level at node 290 and the fall in voltage level at node 280 can be more drastic, thus causing a data flip. In waveforms 300 for the example data flip, the rise in voltage level at node 290 can be at a sufficient level to turn on NFET pull-down device 240 to an extent to cause a read disturb in the bi-stable flip-flop structure—e.g., node 290 inadvertently transitions from a '0' to a '1' and node 280 inadvertently transitions from a '1' to a '0', as shown in FIG. 3. The data flip causes an error in the memory read operation.

Figure 4:
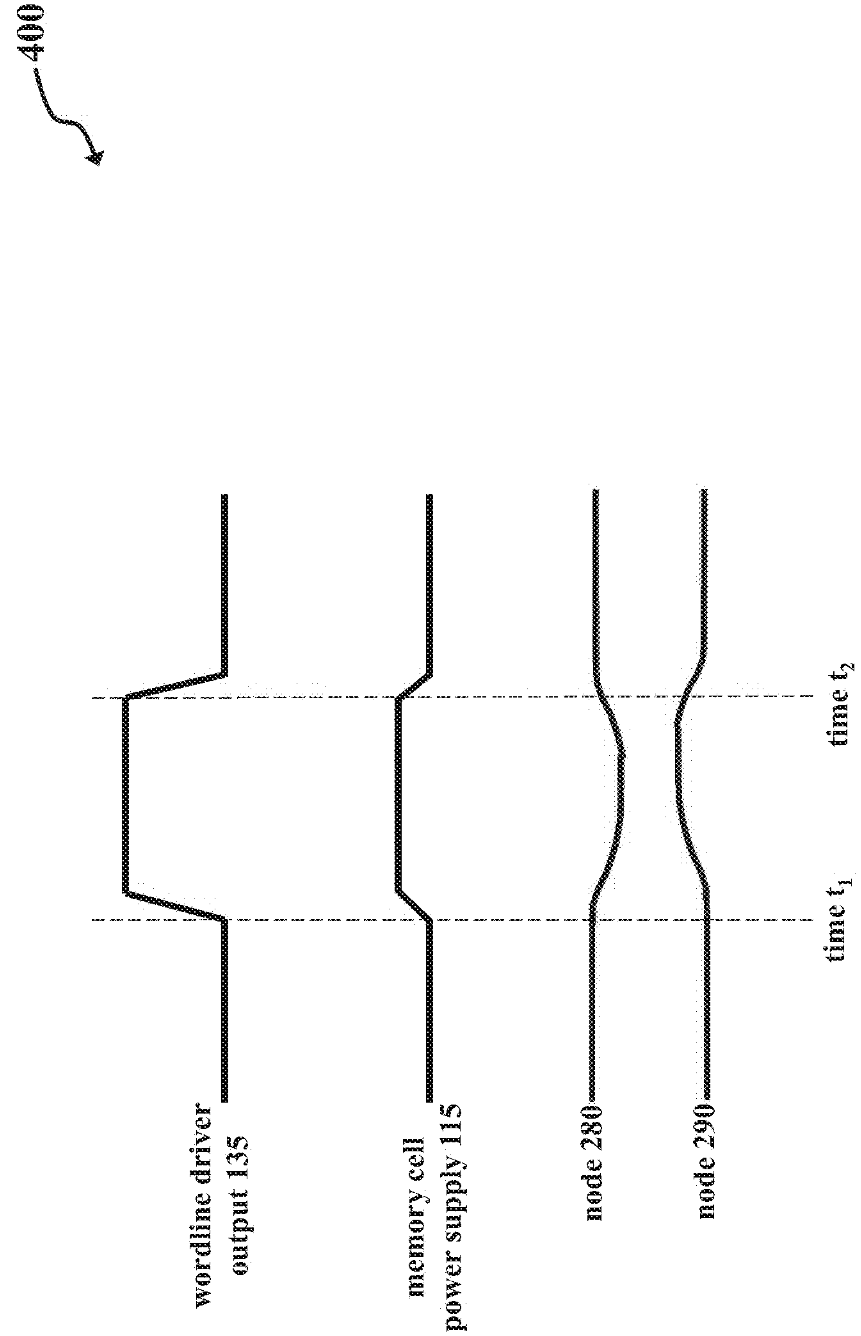
FIG. 4 is an illustration of example waveforms of a voltage level increase in a memory cell power supply during a memory read operation to prevent a data flip in a memory cell, according to some embodiments of the present disclosure.

In some embodiments, to prevent the data flip, the voltage level at node 280 can be increased during the memory read operation. FIG. 4 shows example waveforms 400 of a voltage level increase in memory cell power supply 115 during a memory read operation to prevent a data flip in memory cell 190, according to some embodiments of the present disclosure. Example waveforms 400 are described with reference to SRAM device 100 of FIG. 1 and memory cell 190 of FIG. 2.

Between time $t_1$ and time $t_2$, memory cell 190 is accessed for the memory read operation. To access memory cell 190, at time $t_1$, wordline driver output 135 transitions from a '0' or logic low value (e.g., ground or 0 V) to a '1' or logic high value (e.g., a power supply voltage, such as 1.0 V, 1.2 V, 1.8 V, 2.4 V, 3.3 V, 5 V, or any other suitable voltage), thus turning on NFET pass devices 220 and 230 to pass voltages stored in the bi-stable flip-flop structure to the BL and BLB, respectively. Also, at time $t_1$, memory cell power supply 115 transitions from a voltage level substantially equal to the logic high voltage level of wordline driver output 135 to a voltage level higher than that of the logic high voltage level of wordline driver output 135. For example, at time $t_1$, memory cell power supply 115 can transition from a logic high voltage level (e.g., a power supply voltage, such as 1.0 V, 1.2 V, 1.8 V, 2.4 V, 3.3 V, 5 V, or any other suitable voltage) to a voltage about 25 mV, about 50 mV, about 75 mV, about 100 mV, about 125 mV, about 150 mV, about 175 mV, about 200 mV, or any other suitable voltage higher than that of the logic high voltage level.

Prior to time $t_1$, in an example, node 280 can be at a logic high voltage level (e.g., a power supply voltage, such as 1.0 V, 1.2 V, 1.8 V, 2.4 V, 3.3 V, 5 V, or any other suitable voltage) and node 290 can be at a logic low voltage level (e.g., ground or 0 V). At time $t_1$, when memory cell power supply 115 transitions to a voltage level higher than that of the logic high voltage level (e.g., 1.1 V, 1.3 V, 1.9 V, 2.5 V, 3.4 V, 5.1 V, or any other suitable voltage), node 280 also transitions to the higher voltage level of memory cell power supply 115, according to some embodiments of the present disclosure. With the higher voltage level at node 280, if node 290 rises in voltage level when wordline driver output 135 transitions from a '0' or logic low value to a '1' or logic high value, a data flip can be mitigated or prevented because NFET pull-down device 250 would have a stronger gate drive to decrease node 290's rise in voltage level. As a result, the decrease in node 290's rise in voltage level may not turn on NFET pull-down device 240 to an extent to cause a read disturb in the bi-stable flip-flop structure—e.g., node 290 does not transition from a '0' to a '1' and node 280 does not transition from a '1' to a '0'.

At the end of the memory read operation, when wordline driver output 135 transitions from a '1' or logic high value to a '0' or logic low value at time $t_2$, memory cell power supply 115 transitions from the higher voltage level (e.g., 1.1 V, 1.3 V, 1.9 V, 2.5 V, 3.4 V, 5.1 V, or any other suitable voltage) to a logic high voltage level. Further, at time $t_2$, node 280 and node 290 are re-stored to substantially the same voltage levels as those levels prior to time $t_1$.

Figure 5:
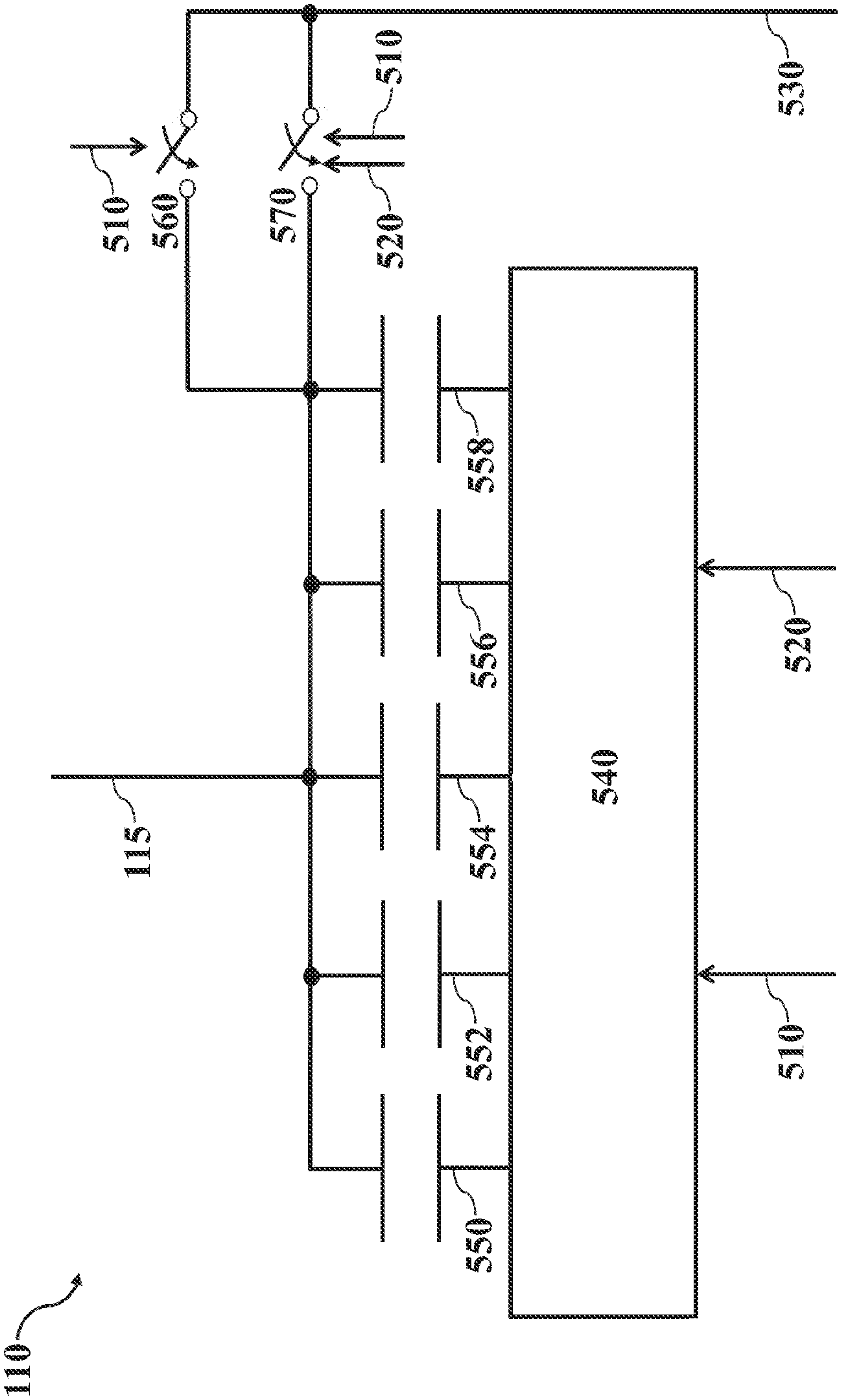
FIG. 5 is an illustration of a memory cell power supply circuit, according to some embodiments of the present disclosure.

FIG. 5 is an illustration of memory cell power supply circuit 110, according to some embodiments of the present disclosure. In some embodiments, memory cell power supply circuit 110 can be a charge pump circuit that includes the following circuit elements: a multiplexer circuit 540; capacitors 550, 552, 554, 556, and 558; and switches 560 and 570.

In some embodiments, multiplexer circuit 540 receives two input signals: a read control signal 510 and a charge pump adjustment signal 520. In some embodiments, read control signal 510 indicates when memory cell power supply circuit 110 is in a memory read mode of operation. For example, when read control signal 510 is a '1' or logic high value, memory cell power supply circuit 110 is at a voltage level higher than that of a logic high voltage level of wordline driver output 135 (e.g., a power supply voltage, such as 1.0 V, 1.2 V, 1.8 V, 2.4 V, 3.3 V, 5 V, or any other suitable voltage). For example, during the memory read mode of operation, memory cell power supply 115 can be at a voltage about 25 mV, about 50 mV, about 75 mV, about 100 mV, about 125 mV, about 150 mV, about 175 mV, about 200 mV, or any other suitable voltage higher than that of the logic high voltage level of wordline driver output 135. When read control signal 510 is a '0' or logic low value, memory cell power supply 115 is at a logic high voltage level (e.g., a power supply voltage, such as 1.0 V, 1.2 V, 1.8 V, 2.4 V, 3.3 V, 5 V, or any other suitable voltage).

In some embodiments, charge pump adjustment signal 520 sets a number of capacitors electrically coupled to power supply 530 when read control signal 510 is at a '1' or logic high value. In some embodiments, power supply 530 can be at a logic high voltage level (e.g., a power supply voltage, such as 1.0 V, 1.2 V, 1.8 V, 2.4 V, 3.3 V, 5 V, or any other suitable voltage). In some embodiments, the logic high voltage level of power supply 530 can be substantially the same voltage level as wordline driver output 135 (e.g., a power supply voltage, such as 1.0 V, 1.2 V, 1.8 V, 2.4 V, 3.3 V, 5 V, or any other suitable voltage).

One or more of capacitors 550, 552, 554, 556, and 558 are electrically coupled to power supply 530 based on a value of charge pump adjustment signal 520. For example, charge pump adjustment signal 520 can include five logic bits, one associated with each of capacitors 550, 552, 554, 556, and 558. The first logic bit can select capacitor 550, the second logic bit can select capacitor 552, the third logic bit can select capacitor 554, the fourth logic bit can select capacitor 556, and the fifth logic bit can select capacitor 558. The number of capacitors connected in parallel with one another can be selected based on setting one or more of the five logic bits to a '1' or logic high value. So, if one logic bit (e.g., any one of the five logic bits) is set to a '1', then a single capacitor (e.g., associated with the selected bit) is selected to be electrically coupled to power supply 530. If two logic bits (e.g., any two of the five logic bits) are set to '1', then two capacitors (associated with the selected bits) are selected to be electrically coupled in parallel with power supply 530. This trend is the same when selecting three, four, and five capacitors to be electrically coupled in parallel with power supply 530. When read control signal 510 transitions to a '0' or logic low value, the selected capacitor(s) are de-coupled from power supply 530.

Based on the number of selected capacitors 550, 552, 554, 556, and 558, the charge pump circuit output (or memory cell power supply 115) can be adjusted. For example, assuming capacitors 550, 552, 554, 556, and 558 have the same capacitance value and the charge pump circuit output is pre-charged to the voltage level of power supply 530, selecting one of the five capacitors can "boost" the voltage level of the charge pump circuit output at a voltage level "Y" (e.g., about 25 mV) above that of power supply 530. The selection of two of the five capacitors can further boost the voltage level of the charge pump circuit output at a voltage level about "2×Y" (e.g., about 50 mV) above that of power supply 530. This trend is the same when selecting three, four, and five capacitors—e.g., boosting the voltage level of the charge pump circuit output at a voltage level about "3×Y" (e.g., about 75 mV), "4×Y" (e.g., about 100 mV), and "5×Y" (e.g., 125 mV) above that of power supply 530, respectively.

The number of capacitors 550, 552, 554, 556, and 558 selected can be based on a desired charge pump circuit output (or memory cell power supply 115), according to some embodiments of the present disclosure. For example, if a memory design requires NFET pull-down device 250 of FIG. 2 to have a particular gate drive to decrease node 290's rise in voltage to a predetermined level during a memory read operation, one or more of capacitors 550, 552, 554, 556, and 558 can be selected to achieve the desired charge pump circuit output. Further, after an initial selection of one or more of capacitors 550, 552, 554, 556, and 558, the charge pump circuit output can be further adjusted by selecting an additional one or more capacitors 550, 552, 554, 556, and 558 (thus providing a higher capacitance than that of the presently-selected capacitor(s)) to increase the voltage level or by de-selecting one or more capacitors 550, 552, 554, 556, and 558 (thus providing a lower capacitance than that of the presently-selected capacitor(s)) to decrease the voltage level.

The capacitance values of capacitors 550, 552, 554, 556, and 558 can vary, according to some embodiments of the present disclosure. In some embodiments, two or more capacitance values of capacitors 550, 552, 554, 556, and 558 can be substantially the same. In some embodiments, the capacitance values of all capacitors 550, 552, 554, 556, and 558 can be different. Though five capacitors are shown in FIG. 5, the charge pump circuit design can incorporate more or less than five capacitors. The number of capacitors can depend on a desired voltage level of the charge pump circuit output (or memory cell power supply 115).

Switches 560 and 570 open and close depending on the values of read control signal 510 and charge pump adjustment signal 520, respectively, according to some embodiments of the present disclosure. Control logic circuits (not shown in FIG. 5) control the opening and closing of switches 560 and 570 based on the values of read control signal 510 and charge pump adjustment signal 520.

In some embodiments, if read control signal 510 is a '0' or logic low value, switch 560 is closed, thus providing power supply 530 (e.g., a power supply voltage, such as 1.0 V, 1.2 V, 1.8 V, 2.4 V, 3.3 V, 5 V, and any other suitable voltage) to memory cell power supply 115. If read control signal 510 is a '1' or logic high value, switch 560 is open.

In some embodiments, when read control signal 510 is a '1' or logic high value and the one or more logic bits associated with charge pump adjustment signal 520 are '0' or logic low value (e.g., the five logic bits associated with each of capacitors 550, 552, 554, 556, and 558 are all '0' or logic low value), switch 570 is closed, thus providing power supply 530 to memory cell power supply 115. Put differently, if no capacitors are selected during a memory read mode of operation, then power supply 530 is provided to memory cell power supply 115. When read control signal 510 is a '1' and at least one of the one or more logic bits associated with charge pump adjustment circuit signal 520 is a '1', switch 570 is open, thus providing a voltage level higher than that of power supply 530 to memory cell power supply 115 through one or more selected capacitors 550, 552, 554, 556, and 558. When read control signal 510 is a '0' and regardless of the values of the one or more logic bits associated with charge pump adjustment signal 520, switch 570 is closed, thus providing power supply 530 to memory cell power supply 115.

Figure 6:
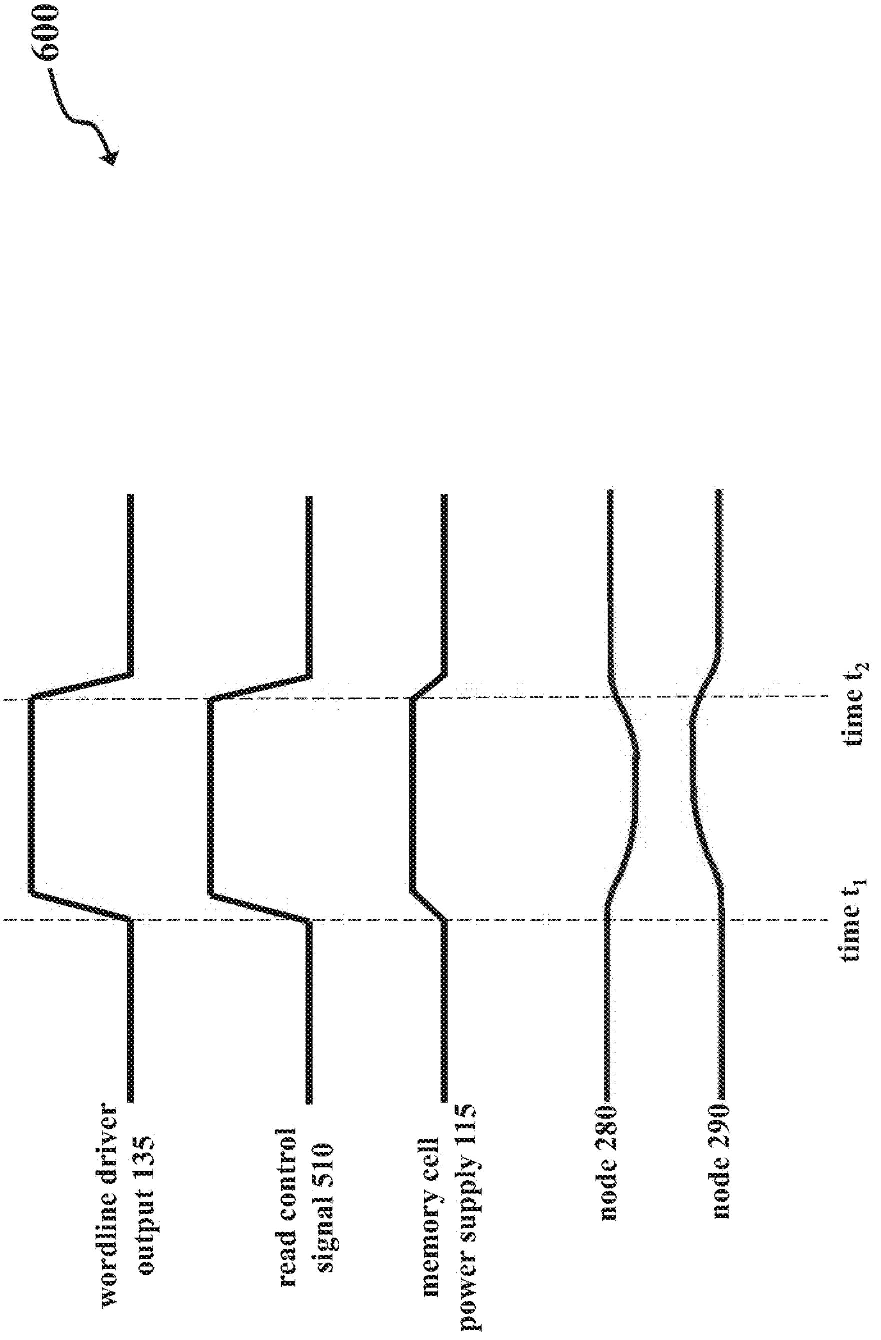
FIG. 6 is an illustration of example waveforms of an operation of a memory cell power supply circuit during a memory read operation, according to some embodiments of the present disclosure.

FIG. 6 is an illustration of example waveforms 600 of an operation of memory cell power supply circuit 110 during a memory read operation, according to some embodiments of the present disclosure. Example waveforms 600 are described with reference to SRAM device 100 of FIG. 1, memory cell 190 of FIG. 2, and memory cell power supply circuit 110 of FIG. 5. Between time $t_1$ and time $t_2$, memory cell 190 is accessed for the memory read operation. To access memory cell 190, at time $t_1$, wordline driver output 135 transitions from a '0' or logic low value (e.g., ground or 0 V) to a '1' or logic high value (e.g., a power supply voltage, such as 1.0 V, 1.2 V, 1.8 V, 2.4 V, 3.3 V, 5 V, or any other suitable voltage), thus turning on pass NFET devices 220 and 230 to pass voltages stored in the bi-stable flip-flop structure to the BL and BLB, respectively. Further, during the memory read operation, read control signal 510 transitions from a '0' or logic low value to a '1' or logic high value.

Also, at time $t_1$ and assuming charge pump adjustment signal 520 is selected (e.g., one or more of capacitors 550, 552, 554, 556, and 558 are electrically coupled to power supply 530), memory cell power supply 115 transitions from a voltage level substantially equal to that of the logic high voltage level of wordline driver output 135 to a voltage level higher than that of the logic high voltage level of wordline driver output 135. For example, at time $t_1$, memory cell power supply 115 can transition from the logic high voltage level (e.g., a power supply voltage, such as 1.0 V, 1.2 V, 1.8 V, 2.4 V, 3.3 V, 5 V, or any other suitable voltage) to a voltage about 25 mV, about 50 mV, about 75 mV, about 100 mV, about 125 mV, about 150 mV, about 175 mV, about 200 mV, or any other suitable voltage higher than that of the logic high voltage level. In some embodiments, prior to wordline driver output 135 being applied to pass devices 230 and 240 (e.g., prior to wordline driver output 135 transitioning from a '0' or logic low value to a '1' or logic high value at time $t_1$), memory cell power supply 115 can transition from a voltage level substantially equal to that of the logic high voltage level of wordline driver output 135 to a voltage level higher than that of the logic high voltage level of wordline driver output 135.

During the memory read operation, node 280 also transitions to the higher voltage level of memory cell power supply 115, according to some embodiments of the present disclosure. With the higher voltage level at node 280, if node 290 rises in voltage level when wordline driver output 135 transitions from a '0' or logic low value to a '1' or logic high value, a data flip can be mitigated or prevented because NFET pull-down device 250 would have a stronger gate drive to decrease node 290's rise in voltage level. As a result, the decrease in node 290's rise in voltage level may not turn on NFET pull-down device 240 to an extent to cause a read disturb in the bi-stable flip-flop structure—e.g., node 290 does not transition from a '0' to a '1' and node 280 does not transition from a '1' to a '0'.

At the end of the memory read operation, when wordline driver output 135 transitions from a '1' or logic high value to a '0' or logic low value at time $t_2$, memory cell power supply 115 transitions from the higher voltage level (e.g., 1.1 V, 1.3 V, 1.9 V, 2.5 V, 3.4 V, 5.1 V, or any other suitable voltage) to a logic high voltage level. Further, at time $t_2$, node 280 and node 290 are re-stored to substantially the same voltage levels as those levels prior to time $t_1$. In some embodiments, after wordline driver output 135 is de-asserted from pass devices 230 and 240 (e.g., after wordline driver output 135 transitions from a '1' or logic high value to a '0' or logic low value at time $t_2$), memory cell power supply 115 can transition from a voltage level higher than that of the logic high voltage level of wordline driver output 135 to a voltage level substantially equal to that of the logic high voltage level of wordline driver output 135.

Figure 7:
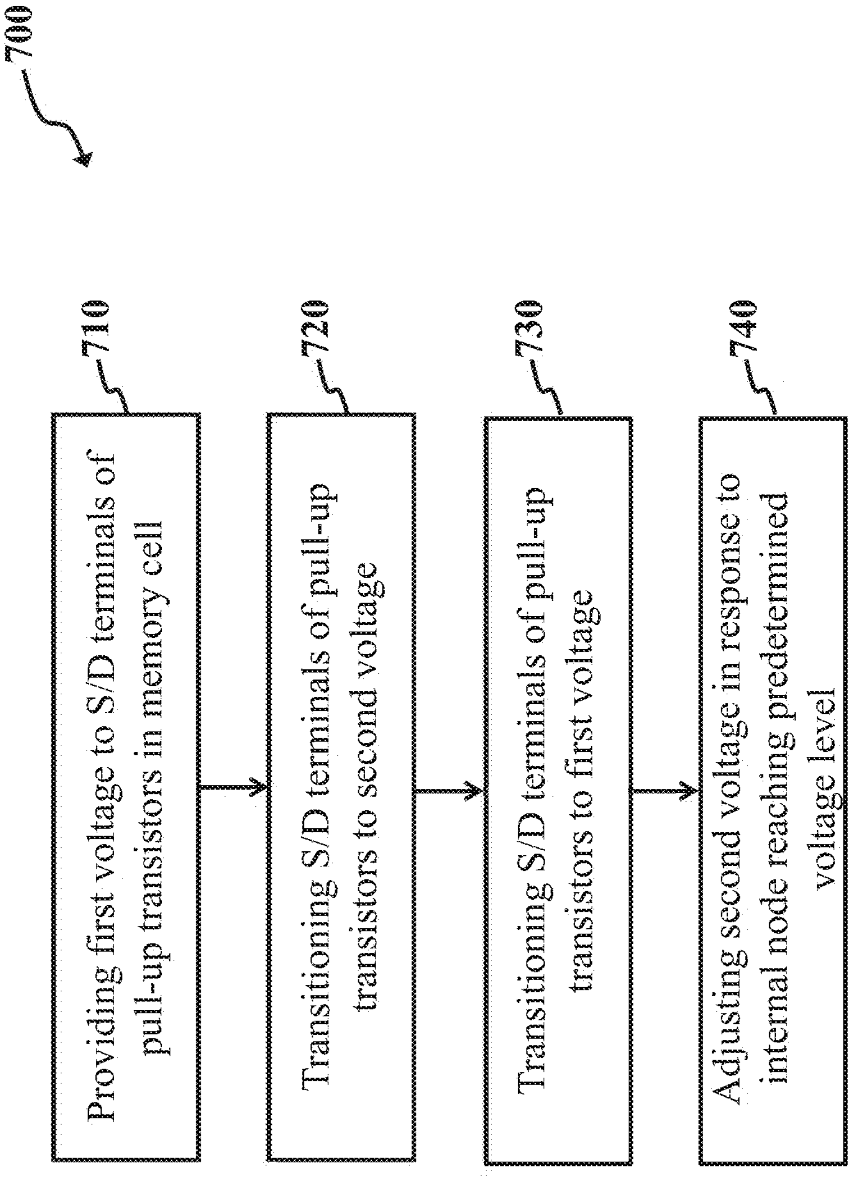
FIG. 7 is an illustration of a method for operating a memory cell power supply circuit during a memory read operation, according to some embodiments of the present disclosure.

FIG. 7 is an illustration of a method 700 for operating a memory cell power supply circuit during a memory read operation, according to some embodiments of the present disclosure. Method 700 applies to the memory cell power supply circuit embodiments described herein. For illustration purposes, the operations of method 700 will be described with reference to SRAM device 100 of FIG. 1, memory cell 190 of FIG. 2, and memory cell power supply circuit 110 of FIG. 5. The operations of method 700 can be performed with other memory cell power supply circuit architectures and can be performed in a different order or not performed depending on specific applications.

In operation 710, a first voltage is provided to source/drain (S/D) terminals of pull-up transistors in a memory cell. Referring to FIGS. 1 and 2, a first voltage from memory cell power supply 115 is provided to S/D terminals of PFET pull-up devices 260 and 270. The first voltage can be a power supply voltage, such as 1.0 V, 1.2 V, 1.8 V, 2.4 V, 3.3 V, 5 V, or any other suitable voltage.

In operation 720, the S/D terminals of the pull-up transistors are transitioned from the first voltage to a second voltage higher than the first voltage for a read operation of the memory cell. Referring to FIGS. 1 and 2, during the read operation, the S/D terminal of PFET pull-up devices 260 and 270 are transitioned from the first voltage to a second voltage higher than the first voltage. In some embodiments, prior to wordline driver output 135 being applied to pass devices 230 and 240 (e.g., prior to wordline driver output 135 transitioning from a '0' or logic low value to a '1' or logic high value at time $t_1$ of FIG. 6), memory cell power supply 115 can transition from the first voltage to the second voltage. For example, during the read operation, memory cell power supply 115 can transition to the second voltage, which can be about 25 mV, about 50 mV, about 75 mV, about 100 mV, about 125 mV, about 150 mV, about 175 mV, about 200 mV, or any other suitable voltage higher than that of the first voltage. Referring to FIG. 5, the charge pump circuit embodiment of memory cell power supply 115 can transition memory cell power supply 115 to the second voltage.

In operation 730, the S/D terminals of the pull-up transistors are transitioned from the second voltage to the first voltage after the read operation of the memory cell. After the memory read operation (e.g., when wordline driver output 135 transitions from a '1' or logic high value to a '0' or logic low value at time $t_2$ of FIG. 6), memory cell power supply 115 transitions the S/D terminals of PFET pull-up devices 260 and 270 from the second voltage (e.g., a higher voltage level, such as 1.1 V, 1.3 V, 1.9 V, 2.5 V, 3.4 V, 5.1 V, or any other suitable voltage) to the first voltage (e.g., a logic high voltage level). In some embodiments, after wordline driver output 135 is de-asserted from pass devices 230 and 240 (e.g., after wordline driver output 135 transitions from a '1' or logic high value to a '0' or logic low value at time $t_2$ of FIG. 6), memory cell power supply 115 can transition from the second voltage to the first voltage.

In operation 740, the second voltage can be adjusted so an internal node of the memory cell reaches a predetermined voltage level. Referring to FIG. 5, upon initial operation of SRAM device 100, the charge pump circuit may be set to particular capacitors 550, 552, 554, 556, and 558 selected to be in parallel via the logic bits in charge pump adjustment signal 520. For example, the logic bits associated with capacitors 550, 552, and 554 may be selected so these capacitors are connected in parallel during a memory read operation.

During subsequent operation of SRAM device 100, a data flip may be observed in one or more memory cells 190 during a memory read operation. To mitigate or prevent the data flip for subsequent memory read operations, the level of the second voltage can be increased by selecting one or more additional capacitors—e.g., by selecting capacitor 556 and/or capacitor 558—thus providing a higher capacitance than that of the presently-selected capacitors.

Alternatively, during subsequent operation of SRAM device 100, the current selection of capacitors may mitigate or prevent a data flip in memory cells 190 of SRAM 180. To lower power consumption in SRAM device 100 during a memory read operation, the level of the second voltage can be decreased by de-selecting one or more capacitors—e.g. by de-selecting one or more of capacitors 550, 552, and 554—thus providing a lower capacitance than that of the presently-selected capacitors.

Embodiments of the present disclosure describe a memory system (e.g., SRAM device 100) with a memory cell power supply circuit (e.g., memory cell power supply circuit 110) to mitigate or prevent a data flip in a memory cell (e.g., memory cell 190) during a memory read operation. During the memory read operation, the memory cell power supply circuit can provide voltage higher than that of a logic high voltage level of a wordline driver (e.g., wordline driver output 135). The higher voltage level provided by the memory cell power supply circuit can be applied to S/D terminals of pull-up devices (e.g., PFET pull-up devices 260 and 270) in the memory cell to increase a gate drive in pull-down devices (e.g., NFET pull-down devices 240 and 250) in the memory cell, thus decreasing a voltage rise in an internal node (e.g., nodes 280 and 290) of the memory cell and mitigating or preventing the data flip.

Embodiments of the present disclosure include a circuit with a first voltage supply, a second voltage supply, pull-up devices, pull-down devices, and pass devices. The first voltage supply (e.g., wordline driver output 135) is configured to provide a first voltage. The second voltage supply (e.g., memory cell power supply 115) is configured to provide the first voltage and a second voltage higher than the first voltage. Each of the pull-up devices (e.g., PFET pull-up devices 260 and 270) includes a first source/drain (S/D) terminal, a second S/D terminal, and a first gate terminal. Each of the pull-down devices (e.g., NFET pull-down devices 240 and 250) includes a third S/D terminal, a fourth S/D terminal, and a second gate terminal. Each of the pass devices (e.g., NFET pass devices 220 and 230) includes a fifth S/D terminal, a sixth S/D terminal, and a third gate terminal. The first voltage supply is configured to apply the first voltage to the third gate terminals of the pass devices. The second voltage supply is electrically coupled to the first S/D terminals of the pull-up devices and is configured to transition from the first voltage to the second voltage for a read operation.

Embodiments of the present disclosure include a system with a voltage supply, a charge pump circuit, and a memory array. The memory array (e.g., SRAM array 180) can include memory cells (e.g., memory cell 190), in which each memory cell includes pull-up devices (e.g., PFET pull-up devices 260 and 270), pull-down devices (e.g., NFET pull-down devices 240 and 250), and pass devices (e.g., NFET pass devices 220 and 230). The voltage supply (e.g., wordline driver output 135) is configured to provide a first voltage to the pass devices. The charge pump circuit (e.g., memory cell power supply circuit 110) is electrically coupled to the pull-up devices and is configured to transition from the first voltage to a second voltage higher than the first voltage for a read operation.

Embodiments of the present disclosure include a method for operating a memory cell power supply circuit during a memory read operation. The method includes the following operations: providing a first voltage to source/drain (S/D) terminals of pull-up devices in a memory cell (e.g., operation 710); transitioning the S/D terminals of the pull-up devices from the first voltage to a second voltage higher than the first voltage for a read operation of the memory cell (e.g., operation 720); transitioning the S/D terminals of the pull-up devices from the second voltage to the first voltage after the read operation of the memory cell (e.g., operation 730); and adjusting the second voltage so an internal node of the memory cell reaches a predetermined voltage level (e.g., operation 740).

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:

a driver circuit configured to provide a power supply voltage to a memory cell; and a voltage supply circuit configured to provide the power supply voltage to the memory cell and a second voltage to the memory cell higher than the power supply voltage, wherein the voltage supply circuit comprises:

a plurality of voltage boosting elements configured to:

increase a voltage level of the power supply voltage to the second voltage based on a first number of selected voltage boosting elements of the plurality of voltage boosting elements, during a first memory read operation of the memory cell; and decrease, in response to preventing a data flip error in the memory cell during the first memory read operation based on the second voltage, a voltage level of the second voltage to a third voltage provided to the memory cell based on a second number of selected voltage boosting elements of the plurality of voltage boosting elements, wherein the third voltage is between the power supply voltage and the second voltage and is applied during a second memory read operation subsequent to the first memory read operation, wherein the second number of selected voltage boosting elements is less than the first number of selected voltage boosting elements, and wherein the plurality of voltage boosting elements are configured to share a first common node electrically connected to the power supply voltage and to share a second common node when selected; and a switch configured to pass the power supply voltage to an output of the voltage supply circuit, in response to a non-selection of any of the plurality of voltage boosting elements;

wherein the memory cell comprises:

a plurality of pull-up devices, wherein each of the plurality of pull-up of devices comprises a first source/drain (S/D) terminal, a second S/D terminal, and a first gate terminal;

a plurality of pull-down devices, wherein each of the plurality of pull-down devices comprises a third S/D terminal, a fourth S/D terminal, and a second gate terminal; and a plurality of pass devices, wherein each of the plurality of pass devices comprises a fifth S/D terminal, a sixth S/D terminal, and a third gate terminal;

wherein the driver circuit is configured to apply the power supply voltage to the third gate terminals of the plurality of pass devices, and wherein the voltage supply circuit is electrically coupled to the first S/D terminals of the plurality of pull-up devices and is configured to transition from the power supply voltage to the second voltage or the third voltage prior to a transition from ground to the power supply voltage applied to the third gate terminals of the plurality of pass devices by the driver circuit.

2. The circuit of claim 1, wherein the plurality of pull-up devices comprise a plurality of p-type transistors.

3. The circuit of claim 1, wherein the plurality of pull-down devices comprise a plurality of n-type transistors.

4. The circuit of claim 1, wherein the plurality of pass devices comprise a plurality of n-type transistors.

5. The circuit of claim 1, wherein the voltage supply circuit is further configured to transition from the second voltage or the third voltage to the power supply voltage after a transition from the power supply voltage to ground applied to the third gate terminals of the plurality of pass devices by the driver circuit.

6. A system, comprising:

a wordline driver circuit;

a charge pump circuit configured to provide a power supply voltage to a memory cell and comprising a plurality of capacitors configured to:

increase a voltage level of the power supply voltage provided to the memory cell to a higher second voltage based on a first number of selected capacitors of the plurality of capacitors, during a memory read operation of the memory cell; and decrease, in response to preventing a data flip error in the memory cell during the memory read operation based on the higher second voltage, a voltage level of the higher second voltage to a third voltage provided to the memory cell based on a second number of selected capacitors of the plurality of capacitors, wherein the third voltage is between the power supply voltage and the higher second voltage, wherein the second number of selected capacitors is less than the first number of selected capacitors, and wherein the plurality of capacitors are configured to share a first common node electrically connected to the power supply voltage and to share a second common node when selected; and a memory array comprising the, wherein the memory cell comprises:
a plurality of pull-up devices;
a plurality of pull-down devices; and
a plurality of pass devices;
wherein the charge pump circuit is electrically coupled to the plurality of pull-up devices and is configured to transition from the higher second voltage or the third voltage to the power supply voltage after a transition from the power supply voltage to ground applied to the plurality of pass devices.

7. The system of claim 6, wherein the charge pump circuit comprises a multiplexer circuit configured to output the higher second voltage based on the first number of selected capacitors electrically coupled to the power supply voltage.

8. The system of claim 7, wherein the charge pump circuit is further configured to adjust the higher second voltage to the third voltage based on a de-selection of one or more of the first number of selected capacitors electrically coupled to the power supply voltage.

9. The system of claim 6, wherein the charge pump circuit is further configured to transition from the power supply voltage to the higher second voltage or to the third voltage prior to a transition from ground to the power supply voltage applied to gate terminals of the plurality of pass devices.

10. The system of claim 6, wherein the plurality of pull-up devices comprise a plurality of p-type transistors, and wherein:
each of the plurality of p-type transistors comprises a first source/drain (S/D) terminal, a second S/D terminal, and a gate terminal, and
one of the first S/D terminal and the second S/D terminal is electrically coupled to the charge pump circuit.

11. The system of claim 6, wherein the plurality of pull-down devices comprise a plurality of n-type transistors.

12. The system of claim 6, wherein the plurality of pass devices comprise a plurality of n-type transistors, and wherein:
each of the plurality of n-type transistors comprises a first source/drain (S/D) terminal, a second S/D terminal, and a gate terminal, and
the gate terminal is electrically coupled to the wordline driver circuit.

13. A method, comprising:
providing a power supply voltage to source/drain (S/D) terminals of pull-up devices in a memory cell;
transitioning, prior to a transition from ground to the power supply voltage applied to pass devices in the memory cell, the S/D terminals of the pull-up devices from the power supply voltage to a second voltage higher than the power supply voltage for a read operation of the memory cell, wherein transitioning the S/D terminals of the pull-up devices comprises:
increasing a voltage level of the power supply voltage to the second voltage based on a first number of selected voltage boosting elements in a voltage supply circuit; and
decreasing, in response to preventing a data flip error in the memory cell during the read operation of the memory cell based on the second voltage, a voltage level of the second voltage to a third voltage provided to the memory cell based on a second number of selected voltage boosting elements,
wherein the third voltage is between the power supply voltage and the second voltage,
wherein the second number is less than the first number, and
wherein the first number of selected voltage boosting elements and second number of selected voltage boosting elements are configured to share a first common node electrically connected to the power supply voltage and to share a second common node when selected; and
transitioning the S/D terminals of the pull-up devices from the second voltage or the third voltage to the power supply voltage after the read operation of the memory cell.

14. The method of claim 13, further comprising adjusting the second voltage for an internal node of the memory cell to reach a predetermined voltage level.

15. The method of claim 14, wherein increasing the voltage level of the power supply voltage comprises selecting at least one of a plurality of voltage boosting elements electrically coupled to the power supply voltage.

16. The method of claim 15, wherein selecting the one of the plurality of voltage boosting elements comprises selecting at least one voltage boosting element from the plurality of voltage boosting elements.

17. The method of claim 15, wherein decreasing the voltage level of the second voltage to the third voltage comprises de-selecting at least one voltage boosting element from the plurality of voltage boosting elements.

18. The method of claim 15, wherein each of the plurality of voltage boosting elements has substantially the same capacitance value.

19. The method of claim 13, wherein transitioning the S/D terminals of the pull-up devices from the power supply voltage to the second voltage or the third voltage comprises transitioning gate terminals of the pass devices from ground to the power supply voltage after transitioning the S/D terminals of the pull-up devices from the power supply voltage to the second voltage or the third voltage.

20. The method of claim 13, wherein transitioning the S/D terminals of the pull-up devices from the second voltage or the third voltage to the power supply voltage comprises transitioning the S/D terminals of the pull-up devices from the second voltage or the third voltage to the power supply voltage after a transition from the power supply voltage to ground applied to the pass devices.

* * * * *